US011945004B2

(12) United States Patent
Tan et al.

(10) Patent No.: US 11,945,004 B2
(45) Date of Patent: Apr. 2, 2024

(54) SYSTEM AND METHOD OF CLEANING AND INSPECTING SEMICONDUCTOR DIE CARRIER

(71) Applicant: UTAC Headquarters Pte. Ltd., Singapore (SG)

(72) Inventors: Hua Hong Tan, Singapore (SG); Wing Keung Lam, Dongguan (CN); Zong Xiang Cai, Dongguan (CN); Wei Ming Xian, Dongguan (CN); Yao Hong Wu, Dongguan (CN); Tao Hu, Dongguan (CN)

(73) Assignee: UTAC Headquarters Pte. Ltd., Singapore (SG)

( * ) Notice: Subject to any disclaimer, the term of this patent is extended or adjusted under 35 U.S.C. 154(b) by 253 days.

(21) Appl. No.: 17/454,514

(22) Filed: Nov. 11, 2021

(65) Prior Publication Data

US 2023/0058682 A1 Feb. 23, 2023

Related U.S. Application Data

(60) Provisional application No. 63/260,358, filed on Aug. 18, 2021.

(51) Int. Cl.
*B08B 1/00* (2006.01)
*B08B 1/02* (2006.01)
*B08B 5/04* (2006.01)

(52) U.S. Cl.
CPC ............... *B08B 1/002* (2013.01); *B08B 1/02* (2013.01); *B08B 5/04* (2013.01); *B08B 5/043* (2013.01)

(58) Field of Classification Search
CPC .. B08B 1/002; B08B 1/02; B08B 3/02; B08B 3/022; B08B 5/043; B08B 5/023
See application file for complete search history.

(56) References Cited

U.S. PATENT DOCUMENTS

| 3,272,651 | A | * | 9/1966 | Quirk | B08B 5/04 15/309.1 |
| 5,806,137 | A | * | 9/1998 | Ishi | H01L 21/02052 257/E21.228 |
| 10,861,726 | B2 | | 12/2020 | Tsai et al. | |
| 2007/0227562 | A1 | * | 10/2007 | Lee | H01L 21/67051 134/198 |
| 2020/0055100 | A1 | * | 2/2020 | Pai | B08B 7/028 |

* cited by examiner

Primary Examiner — Andrew A Horton
(74) Attorney, Agent, or Firm — Robert D. Atkins; PATENT LAW GROUP: Atkins and Associates, P.C.

(57) ABSTRACT

A semiconductor manufacturing equipment cleaning system has a multi-station cleaning and inspection system. Within semiconductor manufacturing equipment cleaning system, a tray cleaning station uses a first rotating brush passing over a first surface of a carrier and possibly semiconductor die, and a second rotating brush passing over a second surface of the carrier and semiconductor die opposite the first surface of the carrier and semiconductor die. Debris and contaminants dislodged from the first surface and second surface of the carrier by the first rotating brush and second rotating brush are removed under vacuum suction. A conveyor transports the carrier through the multi-station cleaning and inspection system. The first rotating brush and second rotating brush move in tandem across the first surface and second surface of the carrier. Air pressure is injected across the first rotating brush and second rotating brush to further remove debris and contaminants.

20 Claims, 17 Drawing Sheets

SYSTEM AND METHOD OF CLEANING AND INSPECTING SEMICONDUCTOR DIE CARRIER

CLAIM OF DOMESTIC PRIORITY

The present application claims the benefit of U.S. Provisional Application No. 63/260,358, filed Aug. 18, 2021, which application is incorporated herein by reference.

FIELD OF THE INVENTION

The present invention relates in general to semiconductor devices and, more particularly, to a system and method of cleaning and inspecting a semiconductor die carrier.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor manufacturing equipment, such as carriers, must be inspected and tested prior to use in the manufacture of semiconductor devices. The inspection procedure typically involves a visual examination of each surface of the carrier looking for cracks, discontinuities, warpage, and other defects. Since the inspection is primarily visual, using computer-controlled cameras or human operators, it is important for the surfaces of the carrier to be clean, free of debris and other contaminants. The same inspection and testing can be done for semiconductor die on the carrier.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
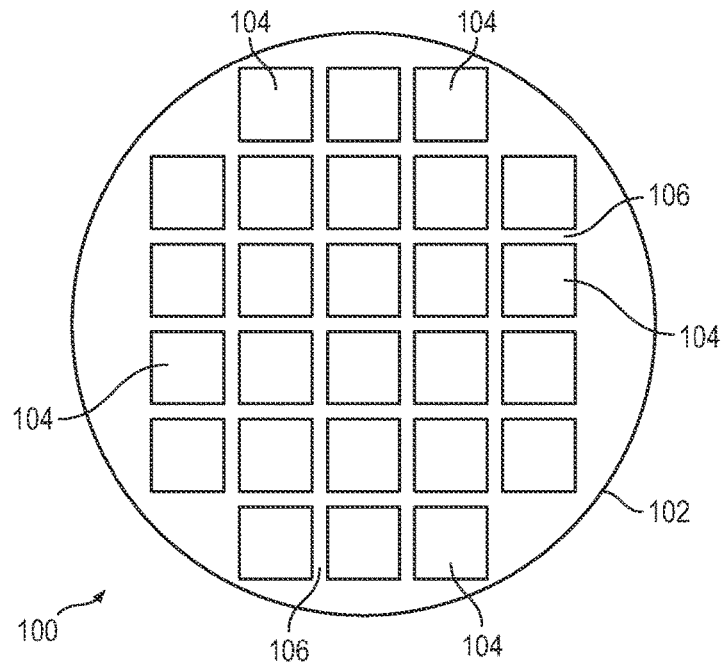
FIGS. 1a-1c illustrate a semiconductor wafer with a plurality of semiconductor die separated by a saw street.

FIG. 1a shows semiconductor wafer or substrate 100 with a base substrate material 102, such as silicon (Si), silicon carbide (SiC), cubic silicon carbide (3C-SiC), germanium, aluminum phosphide, aluminum arsenide, gallium arsenide, gallium nitride, indium phosphide, diamond, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
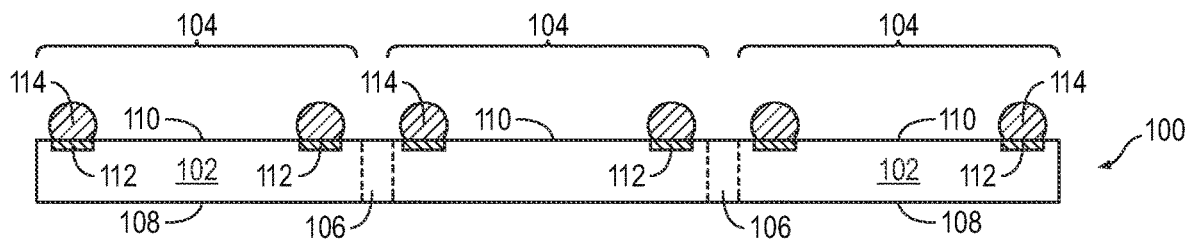

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as diodes, inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
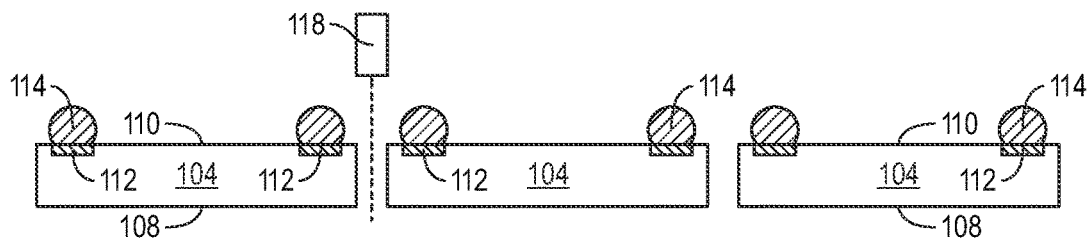

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) post singulation.

Figure 2:
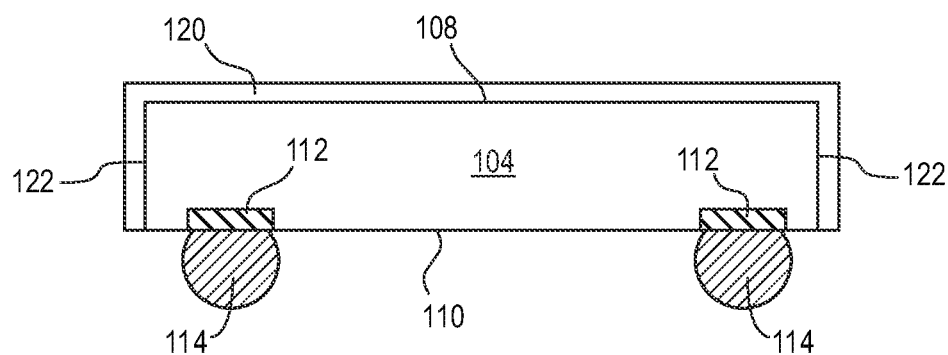
FIG. 2 illustrates an encapsulant deposited over the semiconductor die.

Semiconductor die 104 from FIGS. 1a-1c can be encapsulated to protect its surfaces. FIG. 2 shows encapsulant or molding compound 120 deposited over back surface 108 and side surfaces 122 of semiconductor die 104. Encapsulant 120 can be polymer composite material, such as epoxy resin with filler, epoxy acrylate with filler, or polymer with proper filler. Encapsulant 120 is non-conductive, provides structural support, and environmentally protects the semiconductor device from external elements and contaminants.

Figure 3:
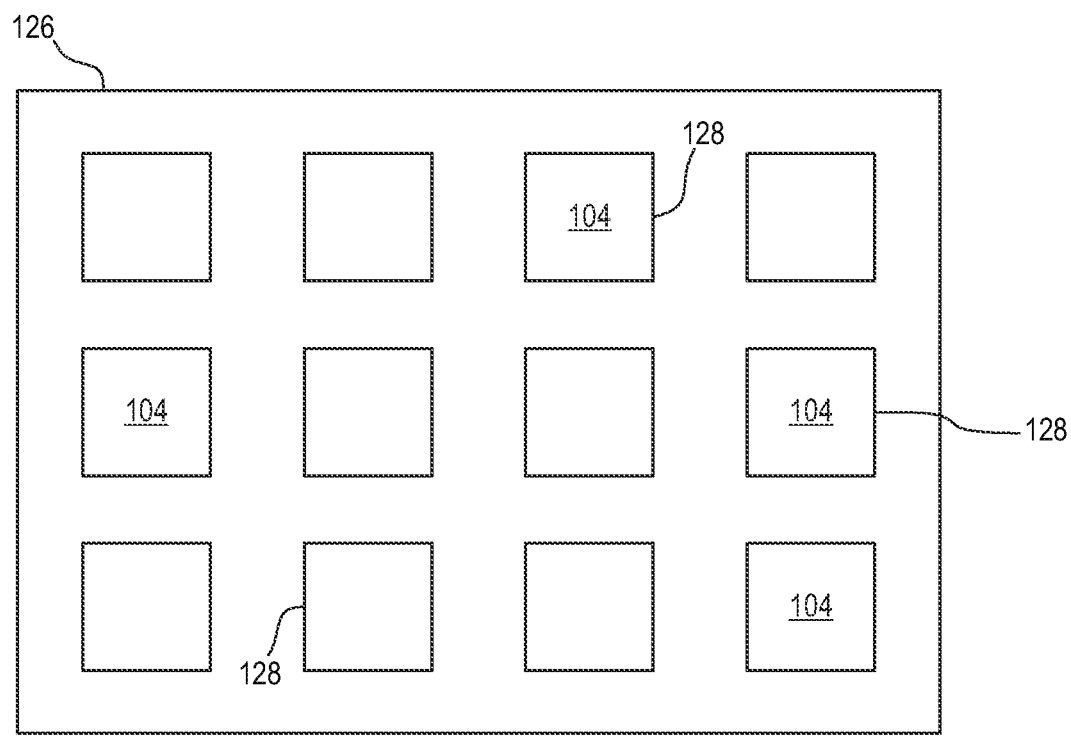
FIG. 3 illustrates a carrier containing one or more semiconductor die.

FIG. 3 illustrates a tray or carrier 126 with openings or slots 128 capable of holding semiconductor die 104.

Semiconductor die 104 from FIG. 2 resides in a flat position within a slot or opening 128 in tray 126 sized to fit the semiconductor die. The top, bottom, and sides of semiconductor die 104 are visible and accessible when disposed in tray 126 for cleaning, inspection, testing, and measurements.

FIGS. 4a-4g illustrate a multi-station cleaning and inspection system 130. Elements with a similar function are assigned the same reference number throughout the figures. Tray 126, containing one or more semiconductor die 104 disposed in slots 128, is placed on conveyor 124 at location 150. Conveyor 124 moves tray 126 in the direction of arrows 131. Tray 126 on conveyor 124 stops at multiple stations for cleaning, inspection, testing, and measurements. For example, tray 126 on conveyor 124 stops at tray cleaning station 132. Tray cleaning station 132 moves tray 126 from conveyor 124 and performs a cleaning process for tray 126 and possibly for semiconductor die 104, discussed further below. After cleaning, tray 126 is returned to conveyor 124. Tray 126 on conveyor 124 moves on and then stops at top or front inspection station 133. Front inspection station 133 performs an inspection of the top or front side of tray 126 and possibly for semiconductor die 104. Tray 126 on conveyor 124 moves on and then stops at side inspection station 134. Side inspection station 134 moves tray 126 from conveyor 124 and performs an inspection of the side surfaces of tray 126 and possibly for semiconductor die 104. After side inspection, tray 126 is returned to conveyor 124. Tray 126 on conveyor 124 moves on and then stops at back inspection station 136. Back inspection station 136 moves tray 126 from conveyor 124 and performs an inspection of the backside of tray 126 and possibly for semiconductor die 104. After back side inspection, tray 126 is returned to conveyor 124. Tray 126 on conveyor 124 moves on and then stops at warpage measurement station 138. Warpage measurement 138 removes tray 126 from conveyor 124 and performs a warpage measurement of tray 126 and possibly for semiconductor die 104. After warpage measurement, tray 126 is returned to conveyor 124. Tray 126 on conveyor 124 moves on to the end of the conveyor for exit from multi-station cleaning and inspection system 130.

Controller 140 provides electrical and mechanical control of conveyor 124, tray cleaning station 132, front inspection station 133, side inspection station 134, back inspection station 136, and warpage measurement station 138. Controller 140 includes an electronic processor, memory, and interface circuits necessary to run programs, schedule events, coordinate actions, and send control signals to the various stations and components of multi-station cleaning and inspection system 130. In one embodiment, tray cleaning station 132, side inspection station 134, and warpage measurement station 138 are located in area 144 on a first side of conveyor 124. Front inspection station 133 and back inspection station 136 are located in area 146 on a second side of conveyor, opposite area 144 on the first side of conveyor 124, to optimize space and operational efficiency of multi-station cleaning and inspection system 130.

Figure 4A:
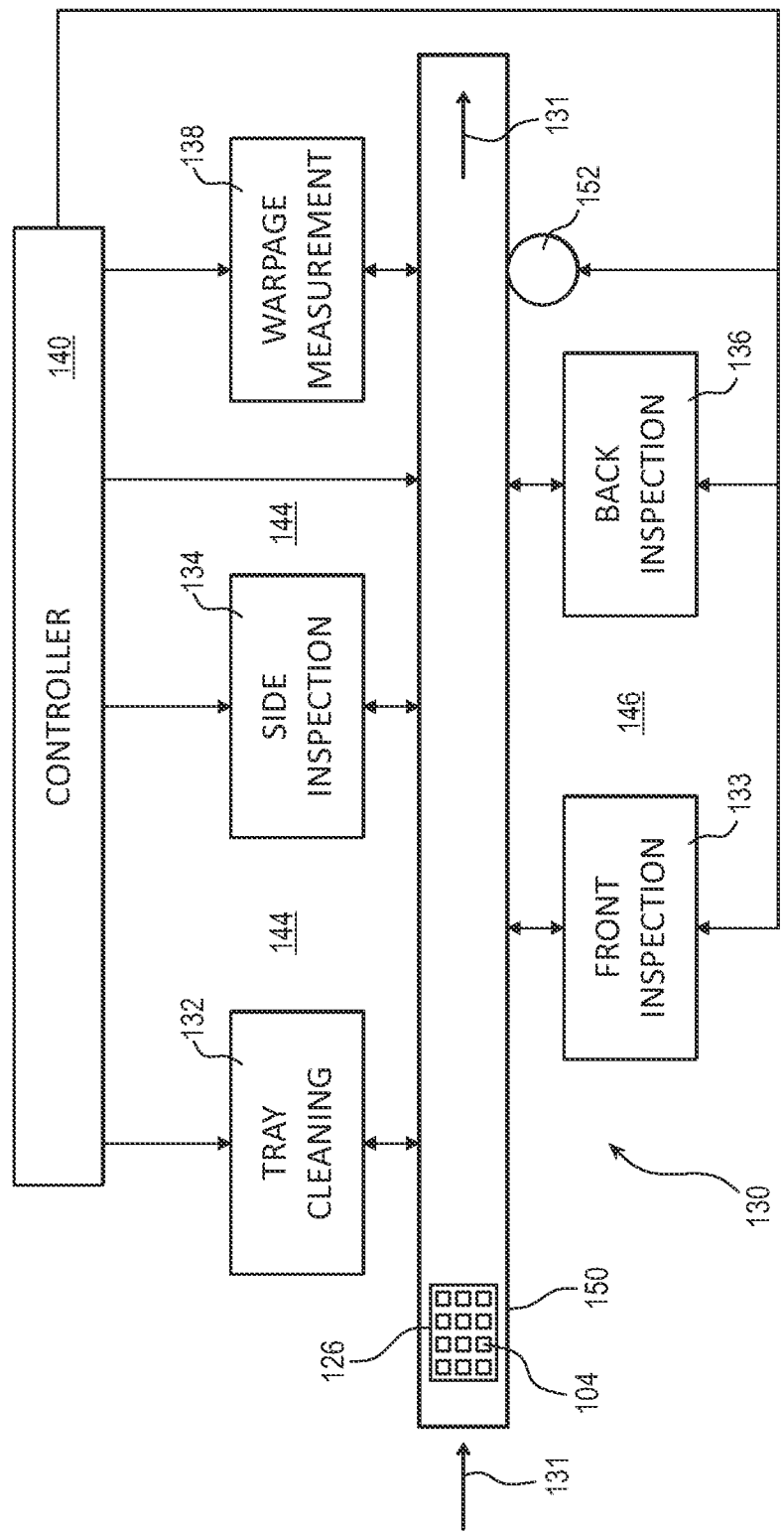
FIGS. 4a-4g illustrate the carrier processing through a multi-station cleaning and inspection system.
Figure 4B:
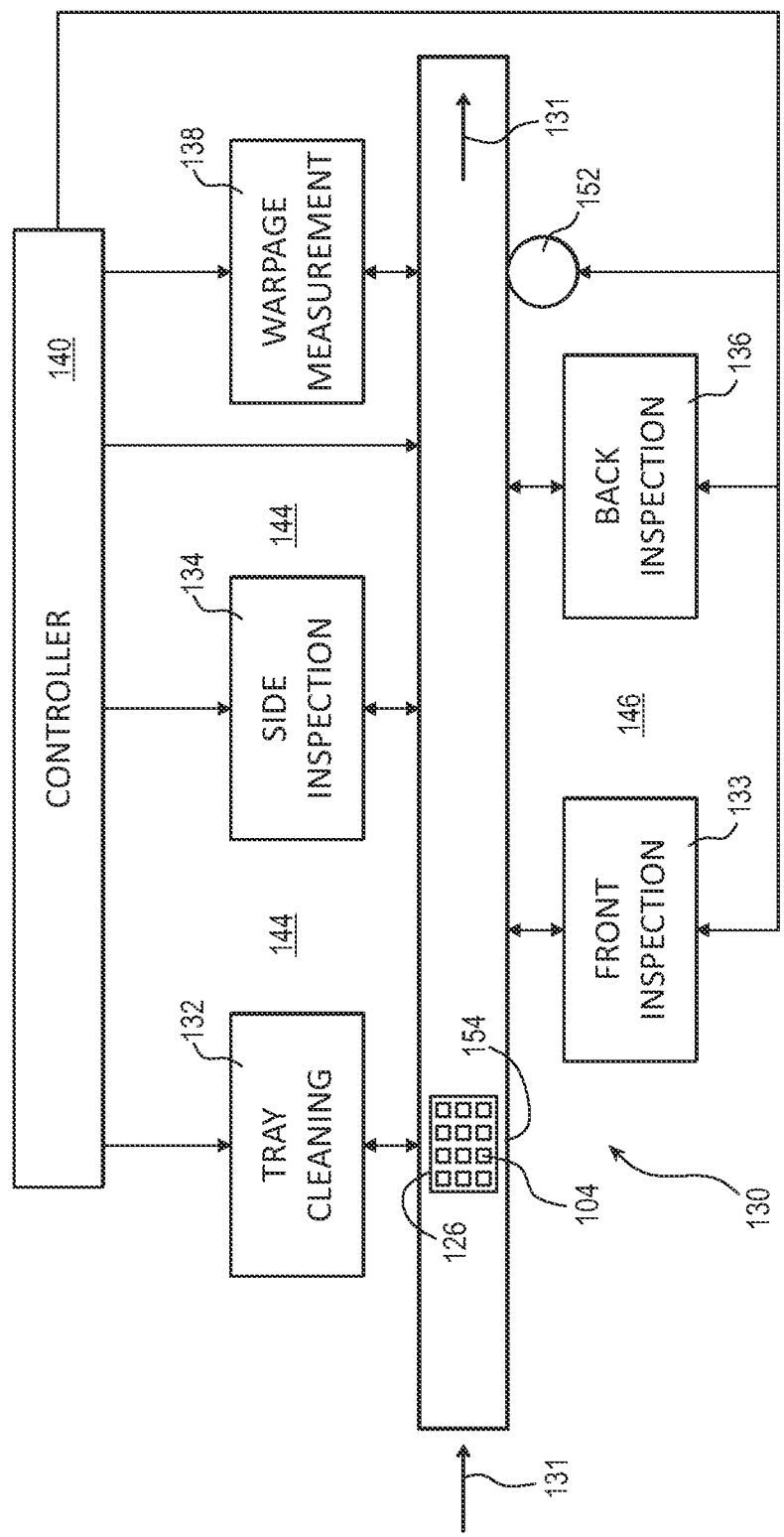

In FIG. 4a, tray 126 is placed on conveyor 124 at location 150. Motor drive 152 receives control signals from controller 140 to advance tray 126 to location 154 proximate to tray cleaning station 132, as shown in FIG. 4b.

Figure 5:
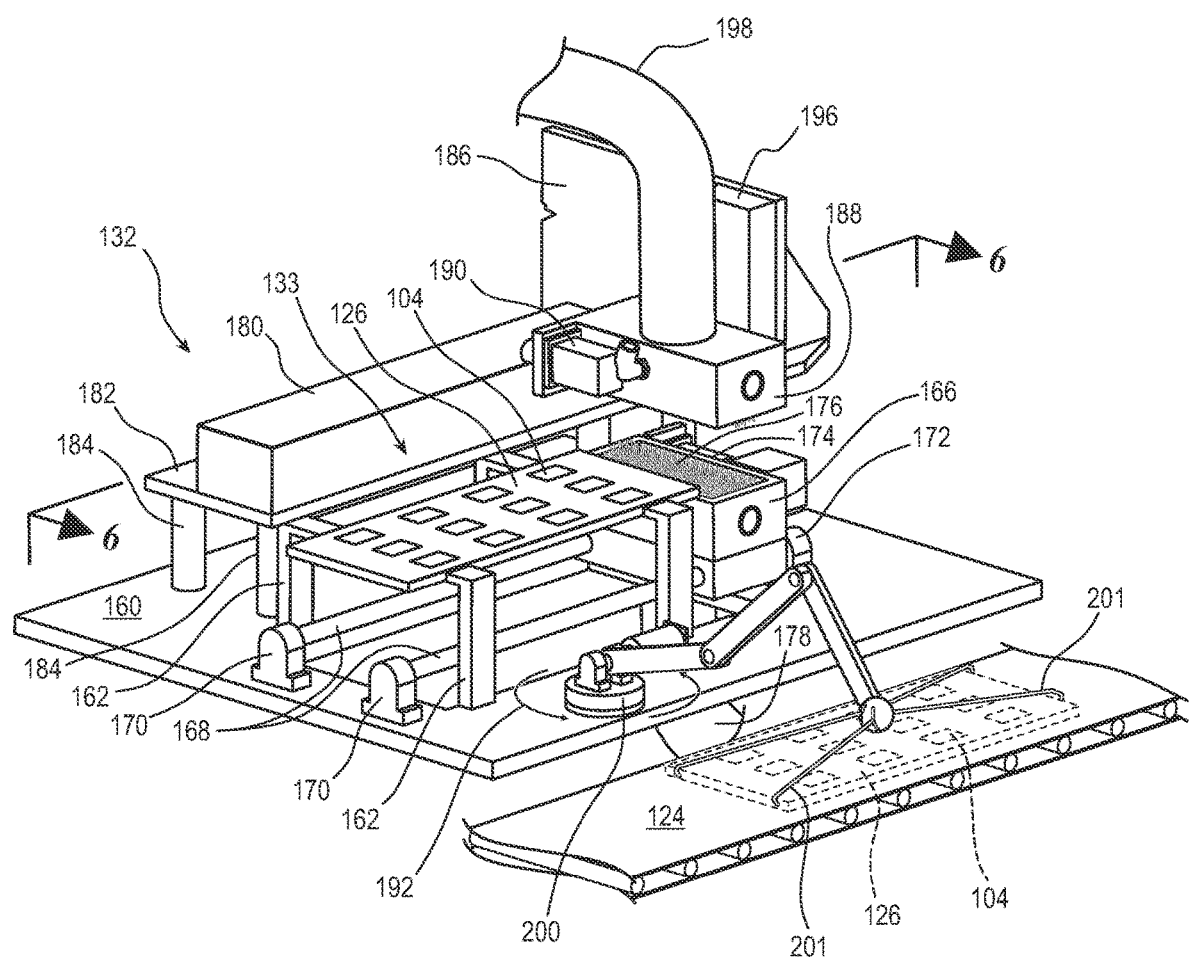
FIG. 5 illustrates further detail of the tray cleaning station within the multi-station cleaning and inspection system.

FIG. 5 shows further detail in a perspective view of tray cleaning station 132. Base plate 160 provides structural support for tray cleaning station 132. Tray support frame 162 extends from base plate 160 to hold tray 126 during the cleaning process. Bottom rotary brush module 166 travels horizontally along guide rails 168 through tray support frame 162 and under tray 126. Guide rails 168 are supported by brackets 170 attached to base plate 160. Guide rail sliding block motor 172 supports and moves bottom rotary brush module 166 along guide rails 168. Bottom rotary brush motor 174 rotates brushes 176 within bottom rotary brush module 166. The rotating brush 176 contacts and moves across the bottom surface of tray 126 and possibly semiconductor die 104 to clean debris and contaminants from these surfaces. Controller 140 sends control signals to guide rail sliding block motor 172 to move bottom rotary brush module 166 horizontally so that rotating brushes 176 within the rotary brush module contacts an entirety of the bottom surface of tray 126, or at least contacting the bottom surface of each tray. Controller 140 also sends control signals to bottom rotary brush motor 174 to rotate brushes 176 within bottom rotary brush module 166 and clean the bottom surface of tray 126, and possibly the bottom surfaces of semiconductor die 104. Vacuum line 178 draws negative pressure or suction within bottom rotary brush module 166 to extract contaminants dislodged or removed from the back and side surfaces of tray 126 and possibly semiconductor die 104.

Ball screw module 180 is supported by plate 182 and support posts 184. Assembly block 186 supports top rotary brush module 188. Ball screw module 180 moves assembly block 186 and top rotary brush module 188 horizontally over tray 126. Top rotary brush motor 190 rotates brushes within top rotary brush module 188. The rotating brush within top rotary brush module 188 contacts and moves across the top surfaces of tray 126 and semiconductor die 104 to clean debris and contaminants from these surfaces. Vertical cylinder 196 moves top rotary brush module 188 in the vertical direction during loading and unloading of tray 126. Controller 140 sends control signals to ball screw module 180 to move top rotary brush module 188 horizontally so that rotating brushes within the rotary brush module contacts an entirety of the top surface of tray 126, or at least contacting the top and side surfaces of each tray and possibly semiconductor die 104 within the tray. Controller 140 also sends control signals to top rotary brush motor 190 to rotate the brushes within top rotary brush module 188 and clean the top surface tray 126 and possibly semiconductor die 104 contained in the tray. Vacuum line 198, similar to vacuum line 178, draws negative pressure or suction within top rotary brush module 188 to extract debris and contaminants dislodged or removed from the top and sides surfaces of tray 126 and possibly semiconductor die 104.

Rotating arm 200 picks up tray 126 with semiconductor die 104 from conveyor 124 with arms 201, rotates 180 degrees in direction of arrow 192, and places the tray on tray support frame 162 prior to cleaning. Rotating arm 200 picks up tray 126 with semiconductor die 104 from tray support frame 162 with arms 201, rotates 180 degrees, and places the tray back on conveyor 124 post cleaning.

Figure 6:
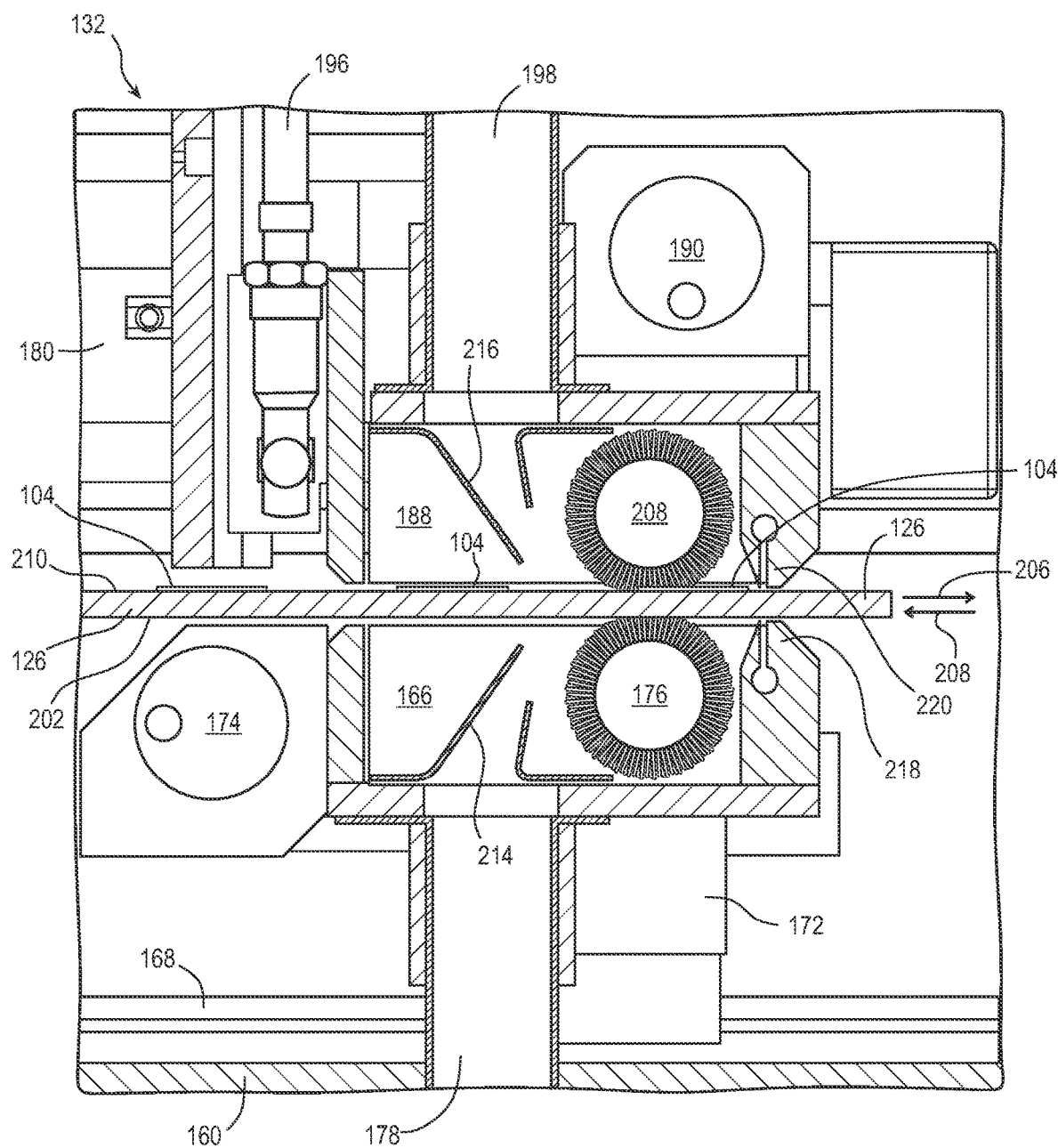
FIG. 6 illustrates a cross-sectional view of the tray cleaning station.

FIG. 6 provides a cross-sectional view of tray cleaning station 132. In particular, the bottom rotary brush module 166 including rotating brushes 176 moves across surface 202 of tray 126, as well as the back and side surfaces of semiconductor die 104, in the direction of arrow 206 during a first pass and then across surface 202, as well as possibly the back and side surfaces of semiconductor die 104, in the direction of arrow 208 during a second pass. Bottom rotary brush motor 174 rotates brushes 176. Top rotary brush module 188 including rotating brushes 208 moves across surface 210 of tray 126, as well as the top and side surfaces of semiconductor die 104, in the direction of arrow 206 during a first pass and then across surface 210 of tray 126, as well as the top and side surfaces of semiconductor die 104, in the direction of arrow 208 during a second pass. Top rotary brush motor 190 rotates brushes 208. Any debris or contaminants dislodged or removed from surface 202 of tray 126 and the back and side surfaces of semiconductor die 104 by brushes 176 is drawn away through separator 214 and out vacuum line 178. Any debris or contaminants dislodged or removed from surface 210 of tray 126 and the top and side surfaces of semiconductor die 104 by brushes 208 is drawn away through separator 216 and out vacuum line 198. Bottom compressed air inlet 218 introduces positive air pressure within bottom rotary brush module 166 to prevent debris accumulation. Top compressed air inlet 220 introduces positive air pressure within top rotary brush module 188 to prevent debris accumulation.

Figure 7:
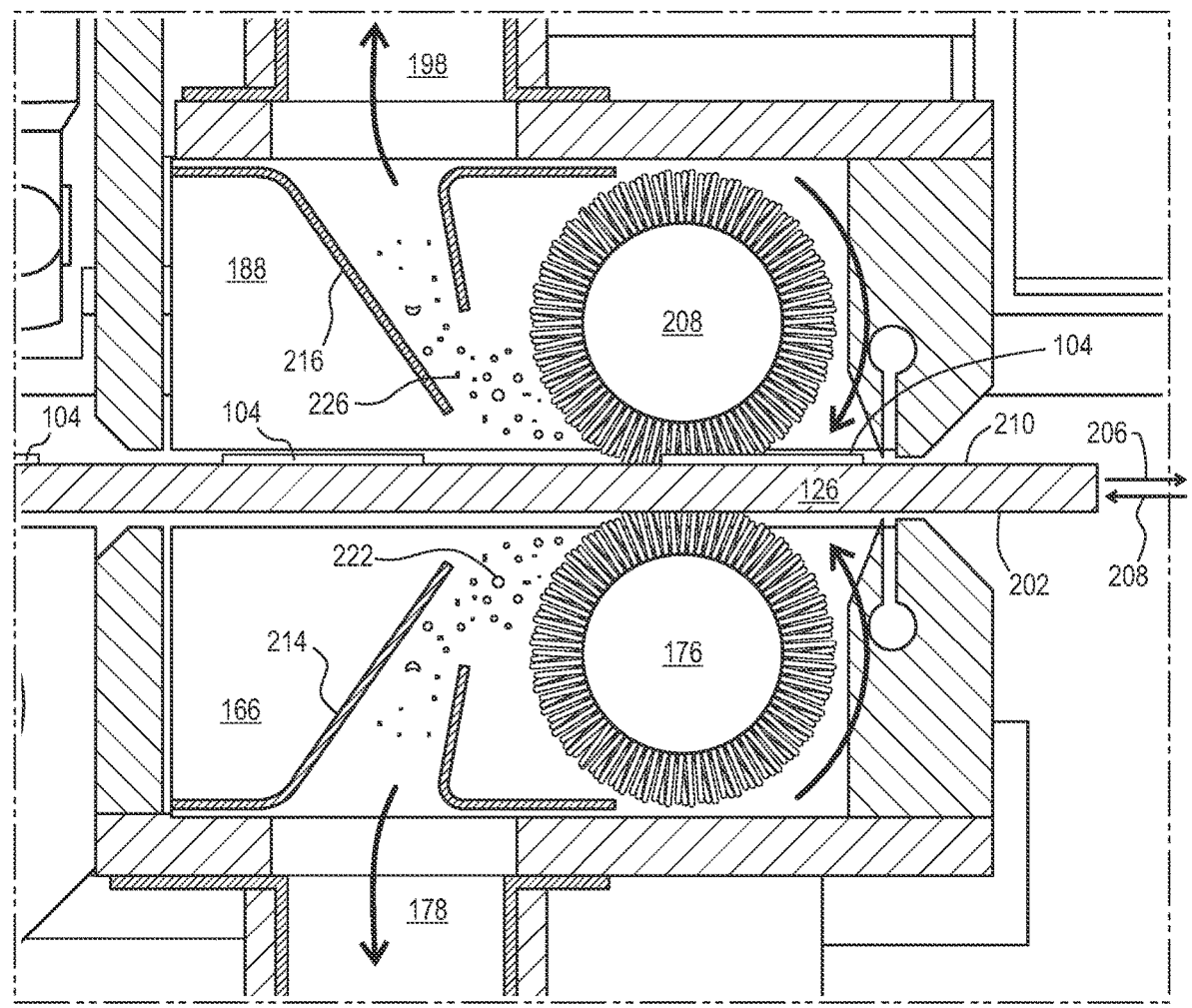
FIG. 7 illustrates further detail of the rotating brushes within the tray cleaning station.

FIG. 7 shows rotating brushes 176 and 208 contacting surfaces 202 and 210 and side surfaces of tray 126, as well as the top, side, and back surfaces of semiconductor die 104, respectively. Rotating brushes 176 and 208 move in tandem, same velocity and relative location, across opposing surfaces 202 and 210 of tray 126, as well as the top, side, and back surfaces of semiconductor die 104. Debris and contaminants 222 dislodged or removed from surface 202 of tray 126, as well as the back and side surfaces of semiconductor die 104, are exhausted through separator 214 out vacuum line 178. Debris and contaminants 226 dislodged or removed from surface 210 of tray 126, as well as the top and side surfaces of semiconductor die 104, are exhausted through separator 216 out vacuum line 198. Bottom rotary brush module 166 and top rotary brush module 188 move across surfaces 202 and 210 of tray 126, as well as the top, side, and back surfaces of semiconductor die 104, respectively, at least once. Alternatively, bottom rotary brush module 166 and top rotary brush module 188 move across surfaces 202 and 210 of tray 126, as well as the top, side, and back surfaces of semiconductor die 104, respectively, once in the direction of arrow 206 and once in the direction of arrow 208. In another embodiment, bottom rotary brush module 166 and top rotary brush module 188 move across surfaces 202 and 210 of tray 126, as well as the top, side, and back surfaces of semiconductor die 104, respectively, a plurality of times in each direction.

Figure 8:
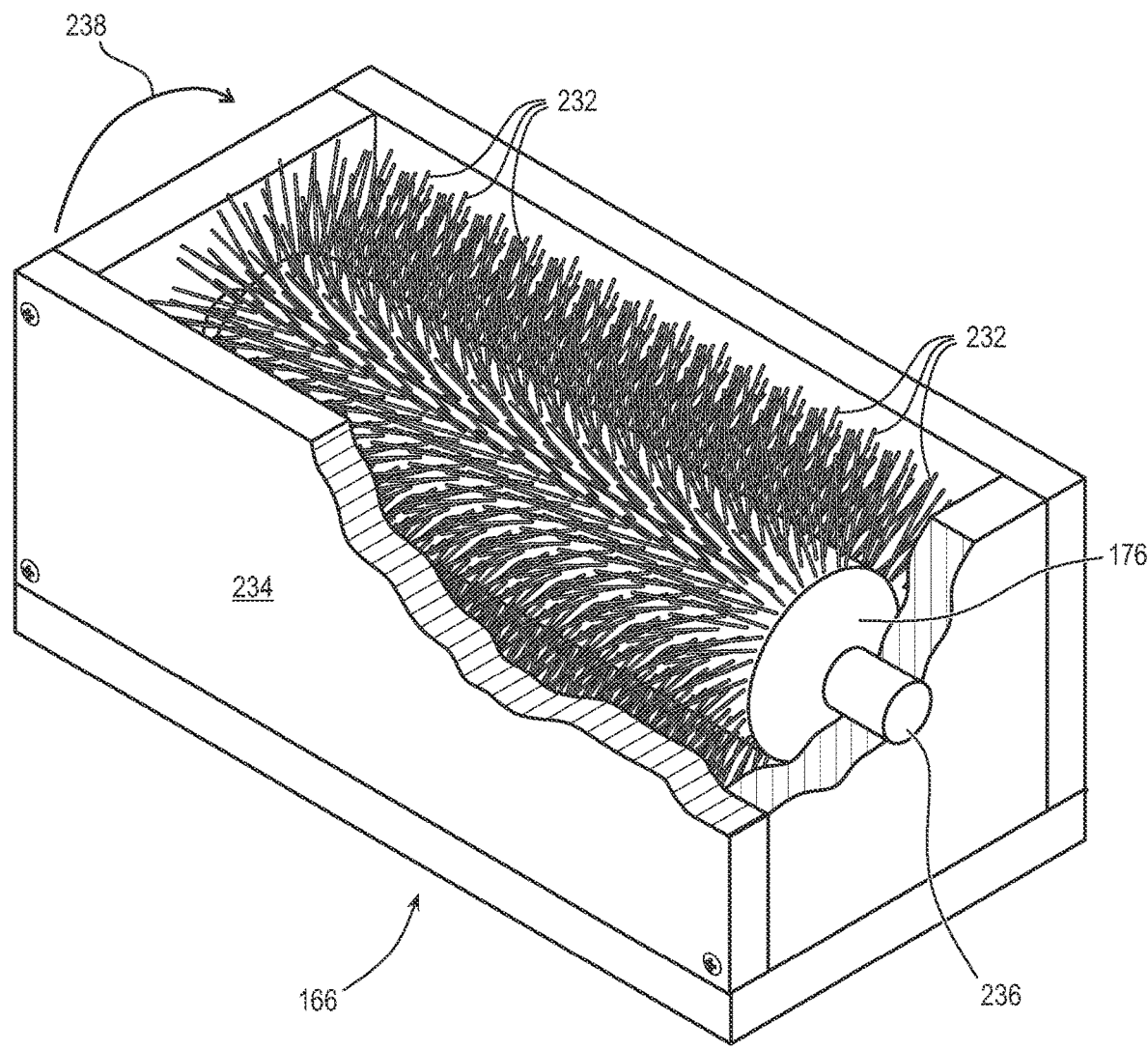
FIG. 8 illustrates further detail of the brush within the rotary brush module.

FIG. 8 shows further detail of bottom rotary brush module 166 with rotating brush 176 including a plurality of individual bristles 232. Brush 176 rotates within housing 234 of bottom rotary brush module 166 along shaft 236. Bristles 232 can be made with nylon, polyester, other synthetic materials, or natural animal hair. An electrostatic discharge (ESD) brush is used if semiconductor die 104 are present. Brush 176 rotates in the direction of arrow 238 as powered by bottom rotary brush motor 174, although the brush can rotate in the opposite direction. Top rotary brush module 188 follows a similar construction and function.

Figure 4C:
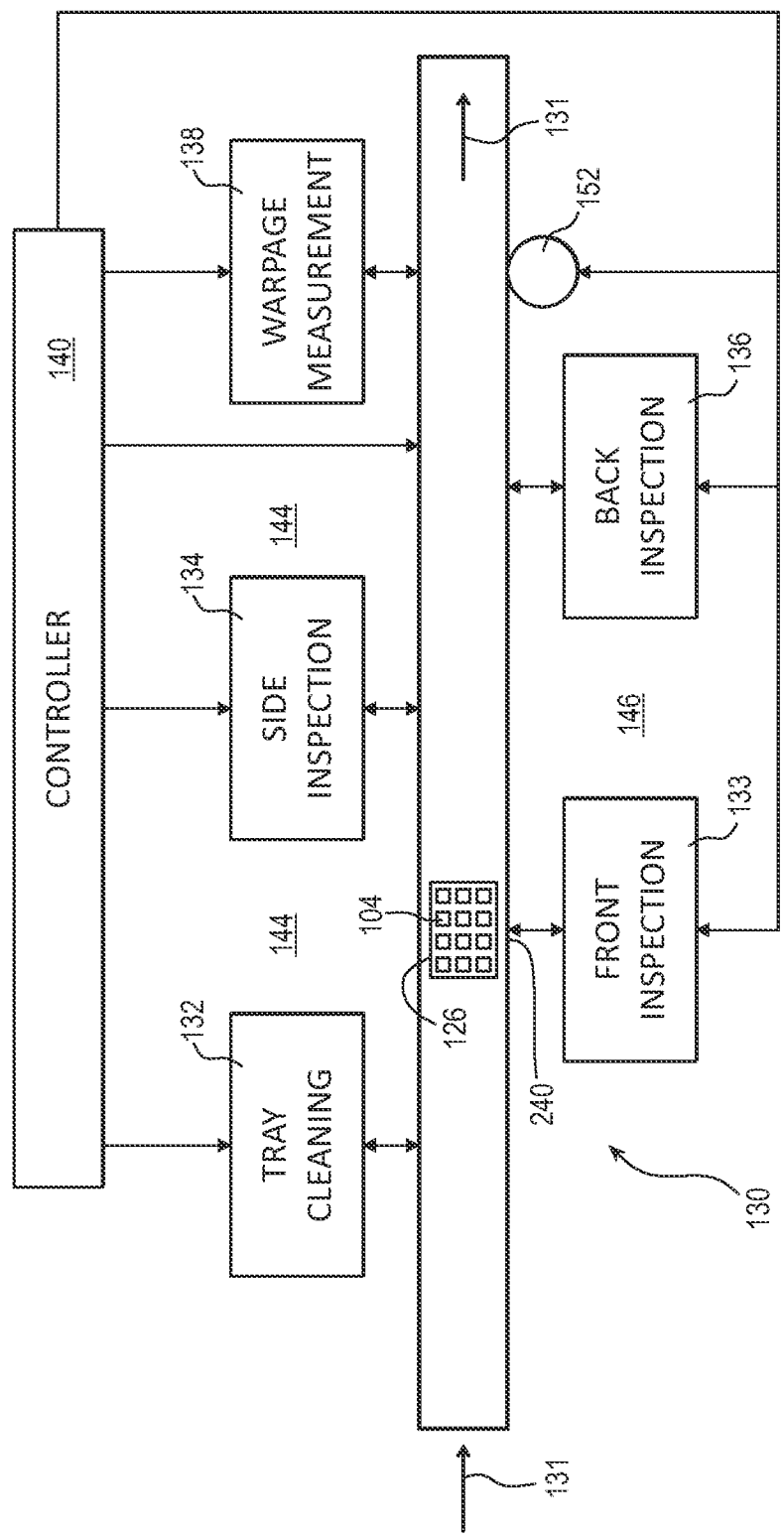

Retuning to FIG. 4b, after the cleaning process within tray cleaning station 132, rotating arm 200 picks up tray 126 from tray support frame 162, rotates 180 degrees, and returns the tray to location 154 on conveyor 124. Motor drive 152 receives control signals from controller 140 to advance tray 126 to location 240 proximate to front inspection station 133, as shown in FIG. 4c.

Figure 9:
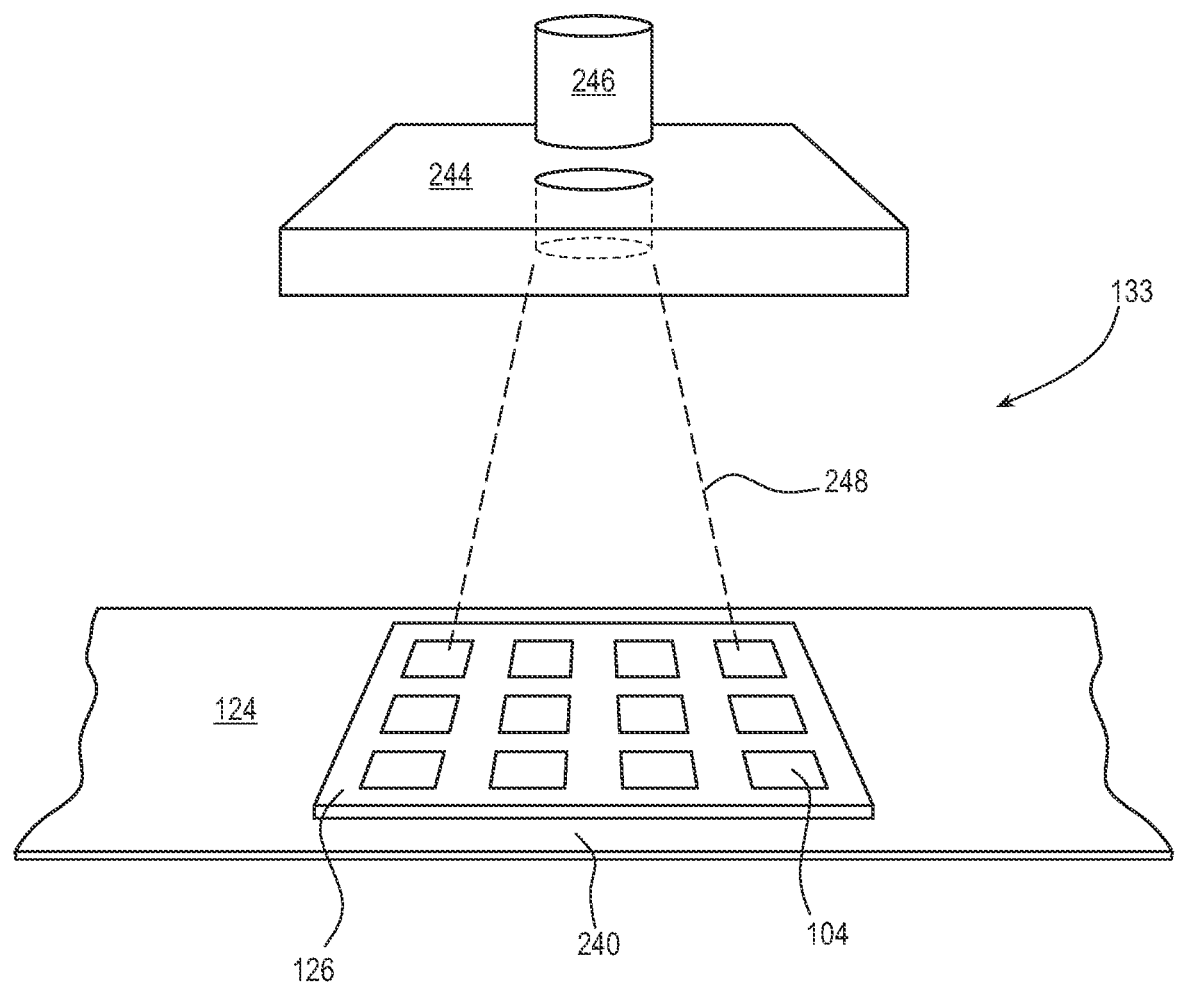
FIG. 9 illustrates further detail of the front inspection station within the multi-station cleaning and inspection system.

FIG. 9 shows further detail in a perspective view of front inspection station 133. Tray 126 is illuminated by light 244. Controller 140 sends control signals for camera 246 to perform auto visual inspection 248 of the top or front side of tray 126, as well as semiconductor die 104 disposed on the tray. The data from visual inspection 248 is returned to controller 140.

Figure 4D:
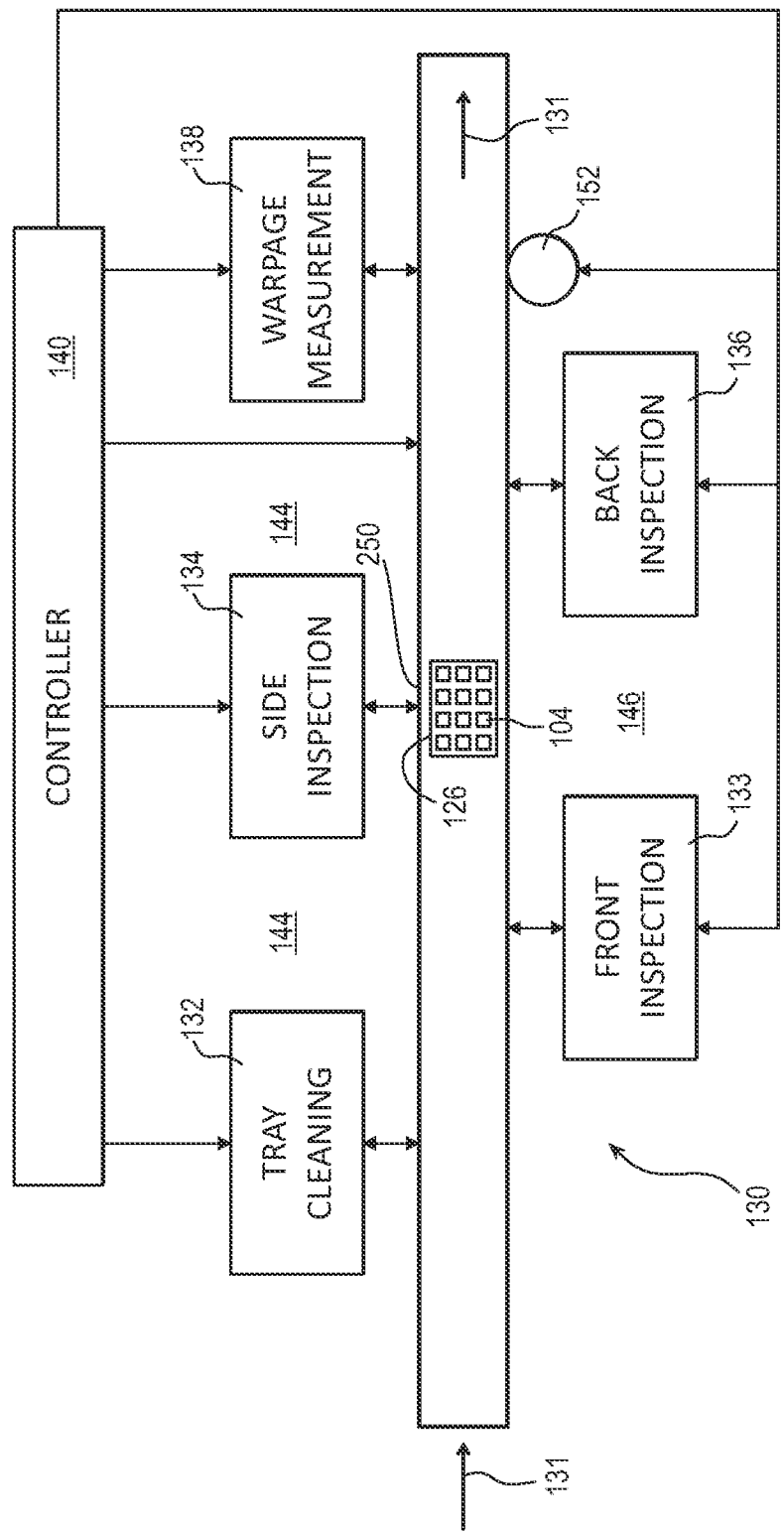

After the front side inspection by front inspection station 133, motor drive 152 receives control signals from controller 140 to advance tray 126 to location 250 proximate to side inspection station 134, as shown in FIG. 4d.

Figure 10:
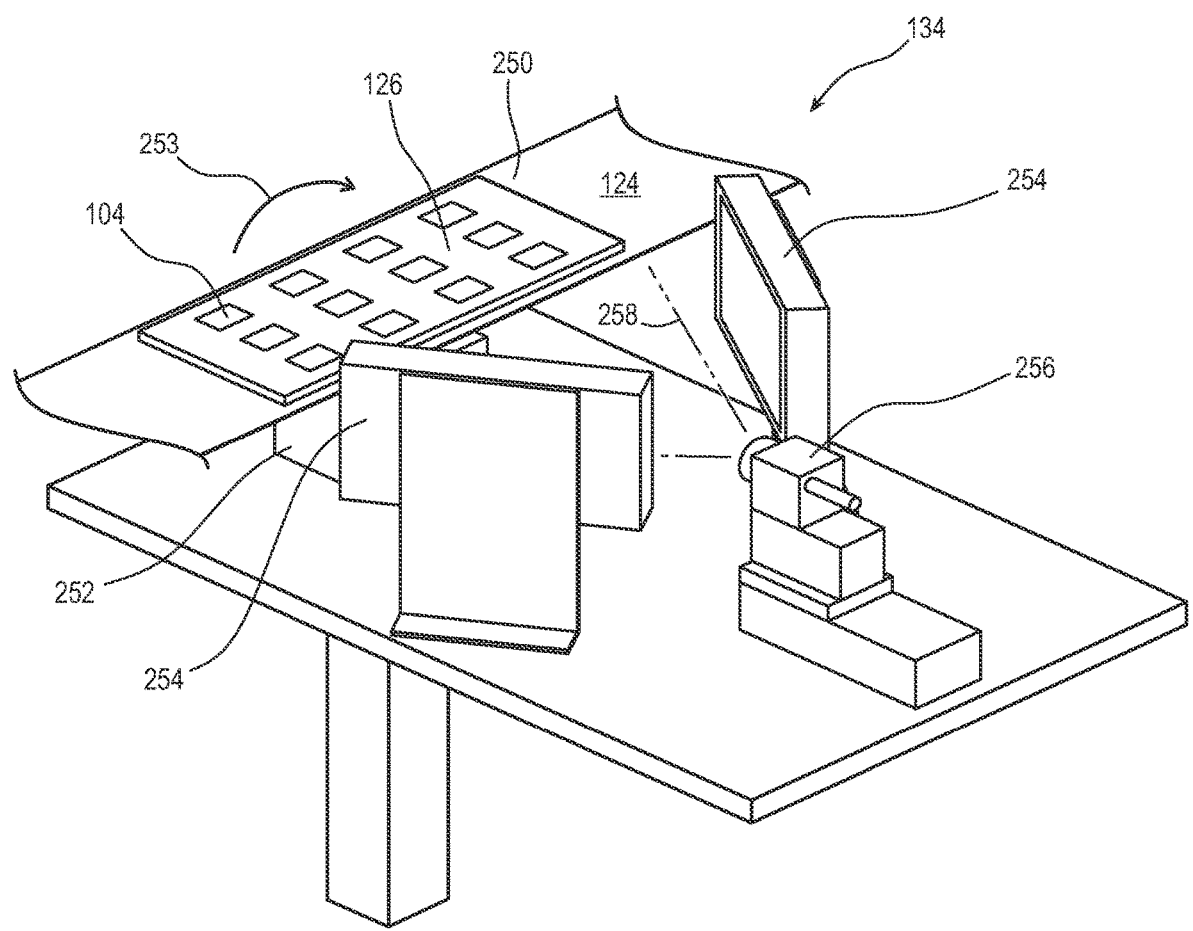
FIG. 10 illustrates further detail of the side inspection station within the multi-station cleaning and inspection system.

FIG. 10 shows further detail in a perspective view of side inspection station 134. Support pillar 252 receives control signals from controller 140 to elevate tray 126 off conveyor 124 and then rotates the tray in the direction of arrow 253. The side surfaces of tray 126 and possibly the side surfaces of semiconductor die 104 disposed on the tray are illuminated by light 254. Controller 140 sends control signals for camera 256 to perform visual inspection 258 of the side surfaces of tray 126, and possibly semiconductor die 104 as disposed on the tray, while the tray is rotating in the direction of arrow 253. The data from the visual inspection 258 is returned to controller 140. Tray 126 is returned to location 250 on conveyor 124, following the side inspection.

Figure 4E:
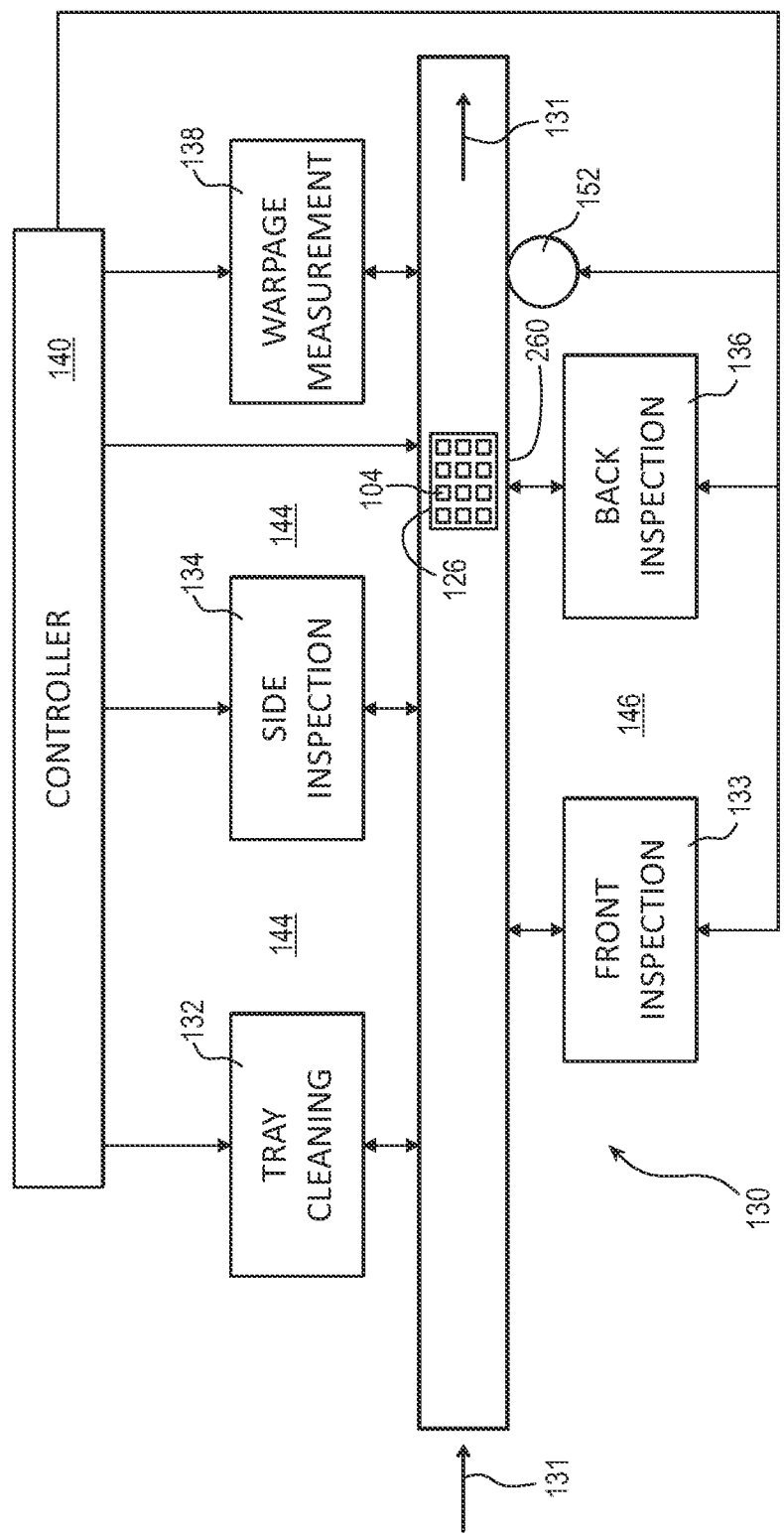

After the side surface inspection by side inspection station 134, motor drive 152 receives control signals from controller 140 to advance tray 126 to location 260 proximate to back inspection station 136, as shown in FIG. 4e.

Figure 11:
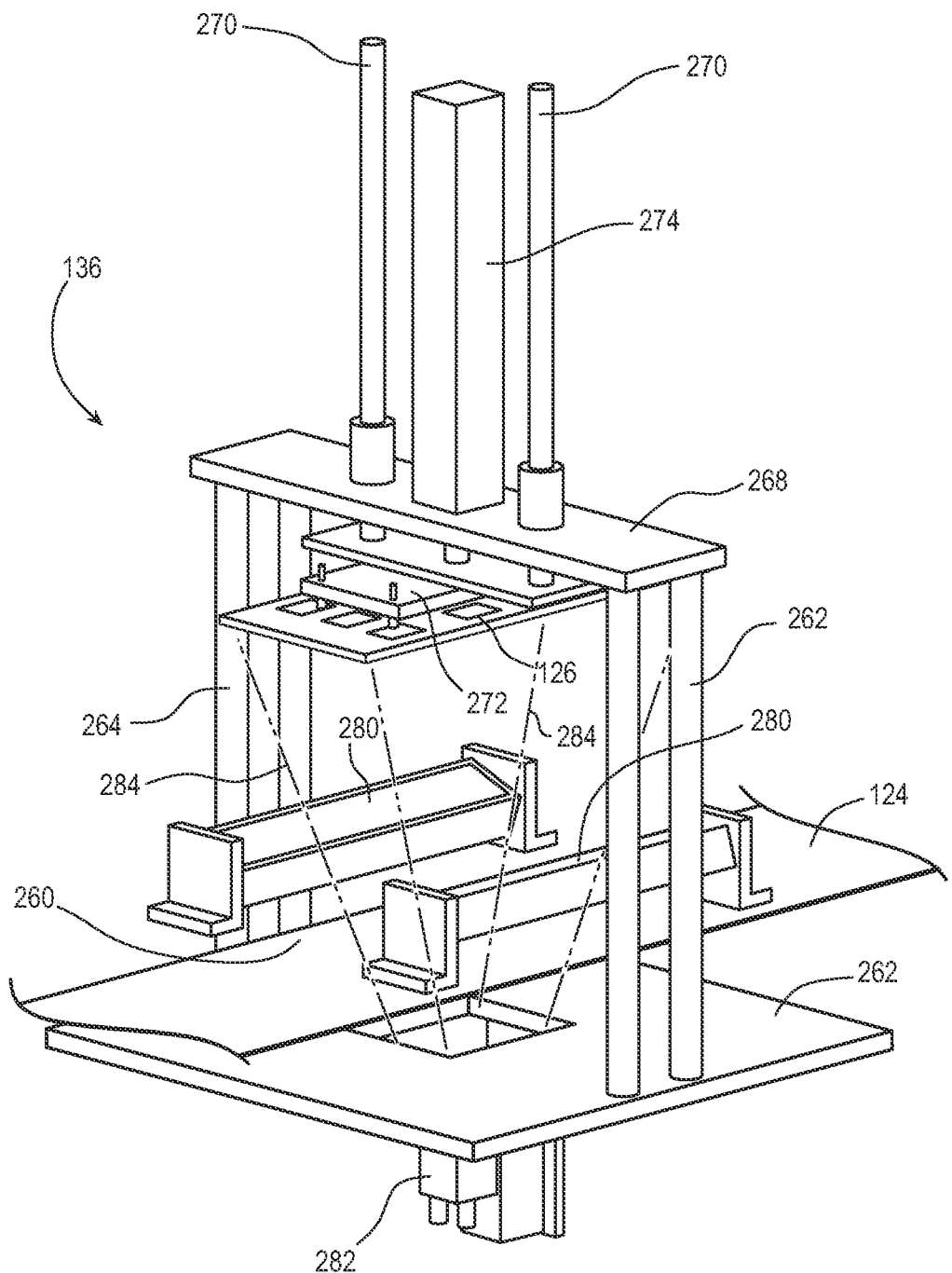
FIG. 11 illustrates further detail of the back inspection station within the multi-station cleaning and inspection system.

FIG. 11 shows further detail in a perspective view of back inspection station 136. Base plate 262 provides structural support for back inspection station 136. Support pillars 264 extend from base plate 262 to support plate 268. Guide rails 270 extend through support plate 268 to tray gripper 272. Air cylinder 274 raises and lowers tray gripper 272 in response to controller 140. Air cylinder 274 receives control signals from controller 140 to elevate tray 126 off conveyor 124. The back surfaces of tray 126, and possibly semiconductor die 104, are illuminated by light 280. Controller 140 sends control signals for camera 282 to perform visual inspection 284 of the back surfaces of tray 126 and semiconductor die 104 disposed on the tray. The data from the visual inspection 284 is returned to controller 140. Tray 126 is returned to location 260 on conveyor 124, following the back inspection.

Figure 4F:
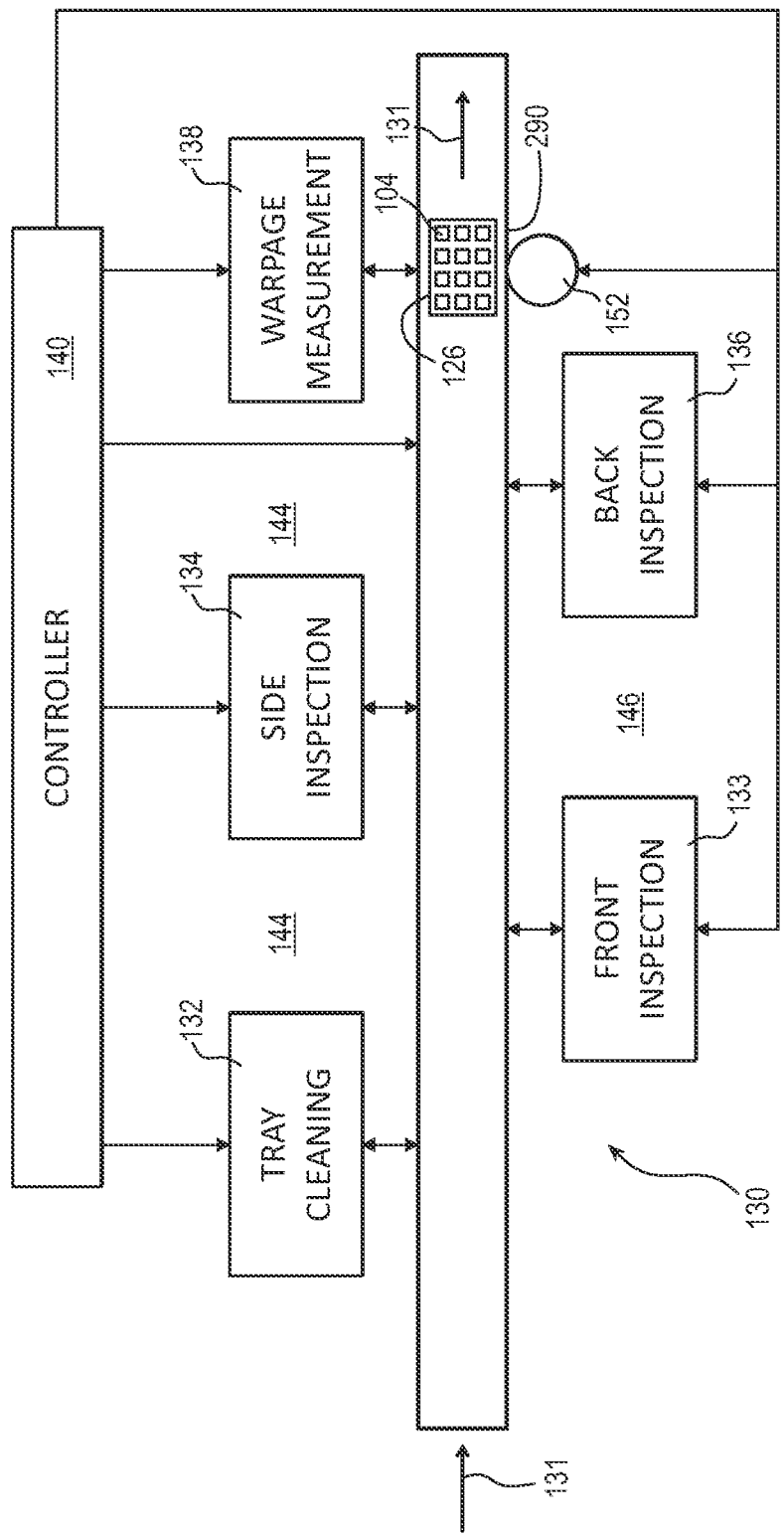

After the back surface inspection by side inspection station 136, motor drive 152 receives control signals from controller 140 to advance tray 126 to location 290 proximate to warpage measurement station 138, as shown in FIG. 4f.

Figure 12:
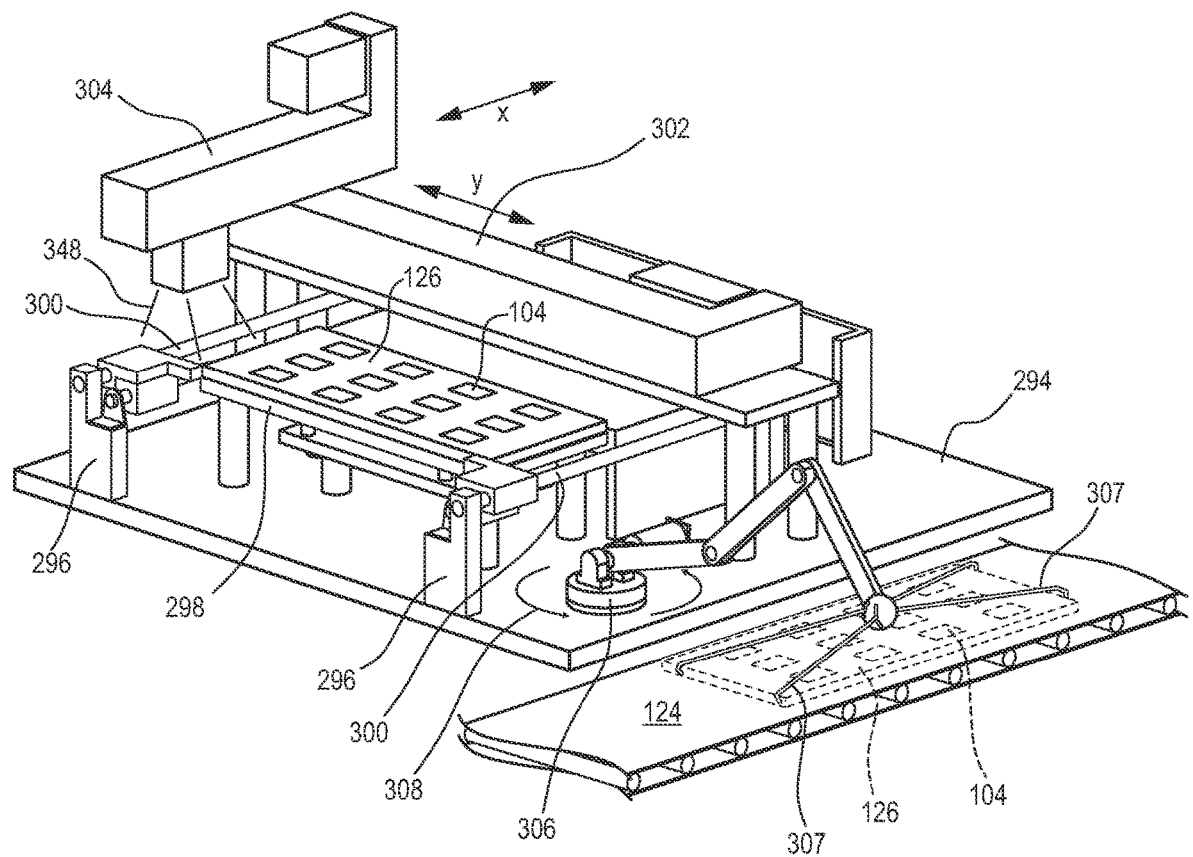
FIG. 12 illustrates further detail of the warpage measurement station within the multi-station cleaning and inspection system.

FIG. 12 shows further detail in a perspective view of warpage measurement station 138. Base plate 294 provides structural support for warpage measurement station 138. Support posts 296 extend from base plate 294 to support tray support frame 298 and guide rails 300. Laser sensor includes at least laser arms 302 and 304, and sensor head 348. Laser arm 302 moves along an x-axis. Laser arm 304 moves along a y-axis with sensor head 348. Rotating arm 306 receives control signals from controller 140 to pick up tray 126 from conveyor 124 with arms 307, rotate in the direction of arrow 308, and place the tray on tray support frame 298. The laser sensor receives control signals from controller 140 to scan tray 126 along the x-axis and along the y-axis for a warpage measurement. The data from the warpage measurements are returned to controller 140. Rotating arm 306 pickups tray 126 from tray support frame 298 with arms 307, rotates 180 degrees, and returns the tray to location 290 on conveyor 124, following the warpage measurement.

Figure 4G:
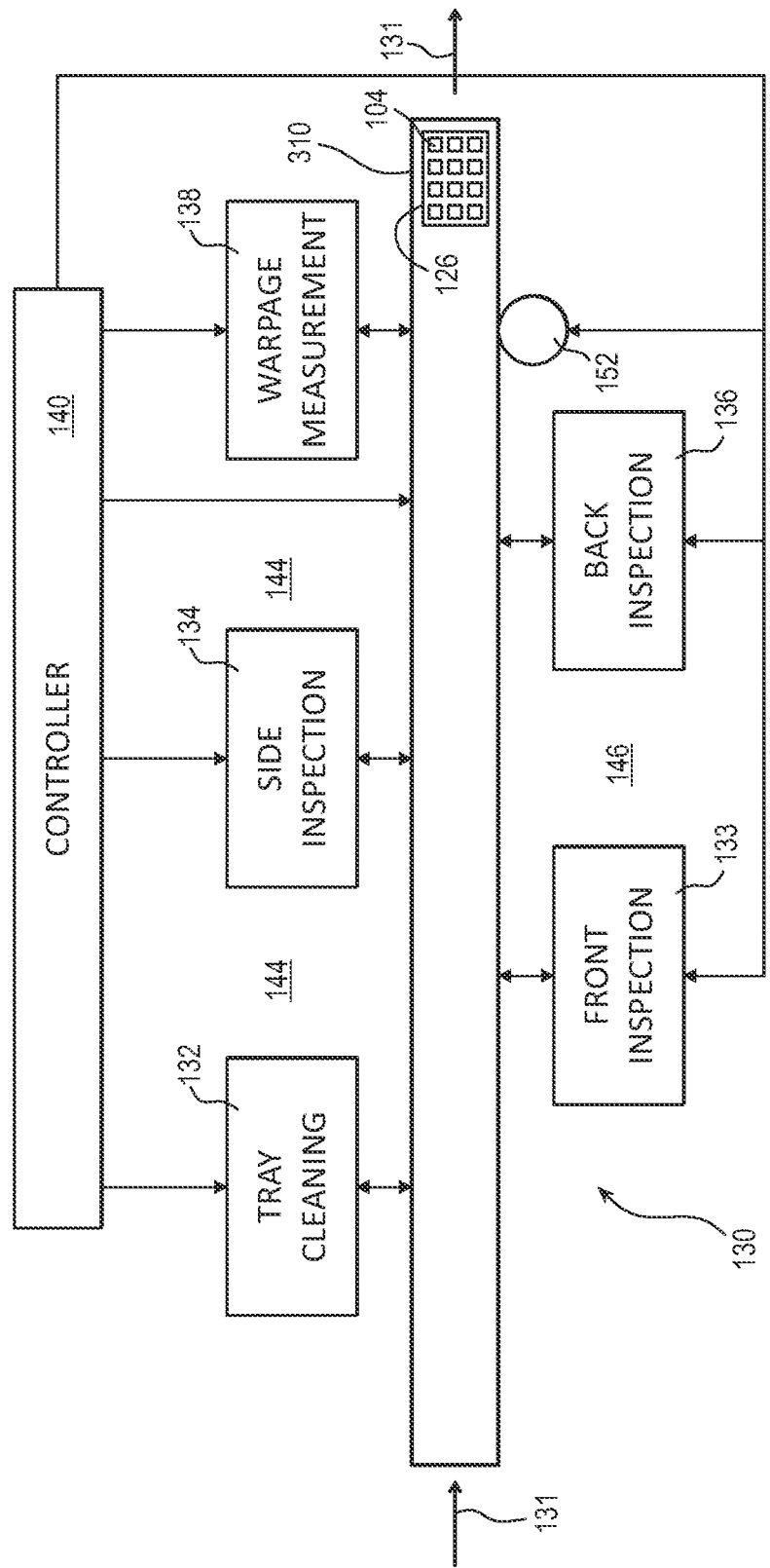

After the warpage measurement by warpage measurement station 138, motor drive 152 receives control signals from controller 140 to advance tray 126 to location 310 as the end of cleaning, inspection, testing, and measurements, as shown in FIG. 4g. Tray 126 is removed from conveyor 124 and continues to the next manufacturing process.

Multi-station cleaning and inspection system 130 provides an efficient process to clean tray 126, as well as semiconductor die 104 on the tray, at station 132, prior to inspection, testing, and measurement at stations 133-138. After cleaning, tray 126 is ready for use in the manufacturing process, and the surfaces of semiconductor die 104 can be more easily and accurately inspected and measured. Multi-station cleaning and inspection system 130 provides a high throughput of trays 126 with reliable inspection, testing, and measurement.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of cleaning a semiconductor manufacturing equipment, comprising:
    providing a carrier;
    passing a first rotating brush over a first surface of the carrier;
    passing a second rotating brush over a second surface of the carrier opposite the first surface of the carrier;
    disposing a first separator in an exhaust path of the first rotating brush to draw away debris dislodged from the first surface of the carrier by the first rotating brush; and
    providing a first vacuum suction through the first separator to remove debris dislodged from the first surface of the carrier by the first rotating brush.

2. The method of claim 1, further including providing a second separator to draw away debris dislodged from the second surface of the carrier by the second rotating brush.

3. The method of claim 2, further including providing a second vacuum suction through the second separator to remove debris dislodged from the second surface of the carrier by the second rotating brush.

4. The method of claim 1, further including providing a conveyor to transport the carrier.

5. The method of claim 1, wherein the first rotating brush and second rotating brush move in tandem across the first surface and second surface of the carrier.

6. The method of claim 1, further including injecting air pressure across the first rotating brush and second rotating brush.

7. A method of cleaning a semiconductor manufacturing equipment, comprising:
    providing a first brush adapted to pass over a first surface of a tray;
    providing a second brush adapted to pass over a second surface of the tray opposite the first surface of the tray;
    providing a first separator to draw away debris dislodged from the first surface of the tray by the first brush; and
    providing a first vacuum suction through the first separator to remove debris dislodged from the first surface of the tray by the first brush.

8. The method of claim 7, further including disposing the first separator in an exhaust path of the first brush to draw away debris dislodged from the first surface of the tray by the first brush.

9. The method of claim 7, further including:
    providing a second separator to draw away debris dislodged from the second surface of the tray by the second brush; and
    providing a second vacuum suction through the second separator to remove debris dislodged from the second surface of the tray by the second brush.

10. The method of claim 7, further including providing a conveyor to transport the tray.

11. The method of claim 7, wherein the first brush and second brush move in tandem across the first surface and second surface of the tray.

12. The method of claim 7, wherein the first brush and second brush rotate while passing over the first surface and second surface of the tray.

13. The method of claim 7, further including injecting air pressure across the first brush and second brush.

14. A semiconductor manufacturing equipment cleaning system, comprising:
    a first brush adapted to pass over a first surface of a carrier; and
    a second brush adapted to pass over a second surface of the carrier opposite the first surface of the carrier;
    a first separator to draw away debris dislodged from the first surface of the carrier by the first brush; and
    a first vacuum suction through the first separator to remove debris dislodged from the first surface of the tray by the first brush.

15. The semiconductor manufacturing equipment cleaning system of claim 14, wherein the first separator is disposed in an exhaust path of the first brush to draw away debris dislodged from the first surface of the carrier by the first brush.

16. The semiconductor manufacturing equipment cleaning system of claim 14, further including a second separator disposed in an exhaust path of the second brush to draw away debris dislodged from the second surface of the carrier by the second brush.

17. The semiconductor manufacturing equipment cleaning system of claim 16, further including a second vacuum suction through the second separator to remove debris dislodged from the second surface of the carrier by the second brush.

18. The semiconductor manufacturing equipment cleaning system of claim 14, wherein the first brush and second brush move in tandem across the first surface and second surface of the carrier.

19. The semiconductor manufacturing equipment cleaning system of claim 14, wherein the first brush and second brush rotate while passing over the first surface and second surface of the carrier.

20. The semiconductor manufacturing equipment cleaning system of claim 14, further including an injector to introduce air pressure across the first brush and second brush.

* * * * *